United States Patent
Knight et al.

(10) Patent No.: US 9,500,194 B2
(45) Date of Patent: Nov. 22, 2016

(54) SUMP PUMP MONITORING DEVICE AND METHOD

(71) Applicant: Sears Brands, L.L.C., Hoffman Estates, IL (US)

(72) Inventors: Colin G. Knight, Winnetka, IL (US); Milos Coric, Lincolnshire, IL (US)

(73) Assignee: SEARS BRANDS, L.L.C., Hoffman Estates, IL (US)

( * ) Notice: Subject to any disclaimer, the term of this patent is extended or adjusted under 35 U.S.C. 154(b) by 223 days.

(21) Appl. No.: 14/253,010

(22) Filed: Apr. 15, 2014

(65) Prior Publication Data

US 2015/0292501 A1 Oct. 15, 2015

(51) Int. Cl.
*G01R 31/14* (2006.01)
*F04B 51/00* (2006.01)
*G01R 31/02* (2006.01)
*F04B 49/06* (2006.01)
*F04B 17/03* (2006.01)
*F04B 49/02* (2006.01)
*H02J 9/06* (2006.01)

(52) U.S. Cl.
CPC ............... *F04B 51/00* (2013.01); *F04B 17/03* (2013.01); *F04B 49/02* (2013.01); *F04B 49/06* (2013.01); *G01R 31/02* (2013.01); *H02J 9/062* (2013.01); *F04B 2203/0201* (2013.01); *F04B 2203/0202* (2013.01)

(58) Field of Classification Search
CPC .. G01R 31/02; G04D 13/086; G04D 13/068; G04D 13/012; G04D 13/08; F04B 49/10; F04B 49/25; F04B 49/065; F04B 49/04; G01F 23/74; G01F 23/265; G01F 23/266; G01F 23/268
See application file for complete search history.

(56) References Cited

U.S. PATENT DOCUMENTS

| | | | | |
|---|---|---|---|---|
| 3,941,507 A * | 3/1976 | Niedermeyer | ........ | F04B 49/025 320/137 |
| 6,676,382 B2 * | 1/2004 | Leighton | ............. | F04D 29/2222 417/12 |
| 7,170,262 B2 * | 1/2007 | Pettigrew | .................. | H02P 9/42 290/40 C |
| 8,297,937 B2 * | 10/2012 | Johnson | .............. | F04D 15/0088 417/44.11 |
| 8,380,355 B2 * | 2/2013 | Mayleben | ............... | F04B 49/06 347/7 |
| 9,157,434 B2 | 10/2015 | Leonard et al. | | |
| 2003/0049134 A1 | 3/2003 | Leighton et al. | | |
| 2006/0008355 A1 * | 1/2006 | Low | ...................... | F04B 49/065 417/36 |

(Continued)

OTHER PUBLICATIONS

"Current Clamp", Wikipedia, the free encyclopedia, 4 pages, dated Jan. 31, 2014.
"Pitboss—Easy to Install Pump and Water Alarm, No Phone Line or WiFi Network Needed", www.pumpalarm.com, 4 pages, dated Jan. 29, 2014.

(Continued)

*Primary Examiner* — Minh N Tang
(74) *Attorney, Agent, or Firm* — McAndrews, Held & Malloy, Ltd.

(57) ABSTRACT

Embodiments for monitoring and powering one or more sump pumps of a sump pump system are disclosed. In one embodiment, a monitoring device includes a battery, a power inverter, a power outlet, and a power cord to receive AC power from an AC power outlet. A sump pump system includes a sump and an AC pump coupled to the power outlet of the monitoring device. The monitoring device is configured to select between AC power received from the AC power outlet and AC power supplied by the battery and the power inverter, and provide the selected AC power to the AC pump via the power outlet of the monitoring device.

18 Claims, 6 Drawing Sheets

(56) References Cited

U.S. PATENT DOCUMENTS

| | | | | |
|---|---|---|---|---|
| 2007/0258827 A1* | 11/2007 | Gierke | F04D 15/029 | 417/6 |
| 2008/0031752 A1* | 2/2008 | Littwin | F04D 15/0072 | 417/411 |
| 2011/0110794 A1* | 5/2011 | Mayleben | F04B 23/021 | 417/53 |
| 2011/0311370 A1* | 12/2011 | Sloss | F04B 47/02 | 417/1 |
| 2015/0143894 A1* | 5/2015 | Cummings | F04D 15/0088 | 73/168 |
| 2015/0143895 A1* | 5/2015 | Cummings | F04D 13/086 | 73/168 |
| 2015/0143896 A1* | 5/2015 | Cummings | F04D 13/086 | 73/168 |

OTHER PUBLICATIONS

"Making Sense of Home Area Network Choices", www.arrayent. com, 4 pages, dated Jan. 31, 2014.
"On the Go? Know your Basement is Protected", www. waynepumps.com, 1 page, dated Jan. 29, 2014.
"Overview", www.arrayent.com, 4 pages, dated Jan. 31, 2014.
"Pitboss—Wireless Alarm System", www.verizonwireless.com/ news/article, 5 pages, dated Jan. 29, 2014.
"Pitboss—Power Alarm, Power Failure Alarm with Text Message Alerts", www.pumpalarm.com, 2 pages, dated Jan. 29, 2014.
"Power Inverter", Wikipedia, the free encyclopedia, 13 pages, dated Mar. 21, 2014.
"Uninterruptible Power Supply", Wikipedia, the free encyclopedia, 15 pages, dated Mar. 21, 2014.

* cited by examiner

SUMP PUMP MONITORING DEVICE AND METHOD

FIELD OF THE INVENTION

Various embodiments relate to sump pump systems, and more particularly, to providing an improved power backup and control feature to sump pump systems.

BACKGROUND OF THE INVENTION

Home basements commonly include perimeter drains that funnel water toward a water collecting sump. A sump pump removes water that has accumulated in the sump and discharges the water away from the home. Since the perimeter drains funnel water toward the sump, the sump may overflow if the sump pump is non-operational or otherwise unable to discharge water from the sump faster than the flow of water into the sump.

The sump pump is typically powered by the main AC (alternating current) electrical system of the home, which may present an issue during a prolonged power outage since the sump pump would be unable to discharge water collected in the sump. Due to the possibility of a power outage, many sump pump systems include a backup pump that is powered by a DC (direct current) battery. In such systems, the backup pump may continue to discharge water from the sump during power outages and potentially prevent costly water damage resulting from a sump overflow.

During heavy storms water may be delivered to the sump at a rate faster than the main pump is capable discharging. The backup pump may be configured to aid the main pump in such situations. In particular, the backup pump may have a float or other sensor that triggers operation of the backup pump when the water level exceeds a normal operating level. In such situations, both the main pump and backup pump may simultaneously discharge water from the sump at a combined rate greater than either pump acting alone.

Thus, proper operation of the sump pump system is crucial to maintaining a dry basement and avoiding costly water damage. In light of this, various warning systems and alarms have been created that sound an audible alarm when a malfunction or possible flooding condition is detected. Existing warning systems provide some additional protection against flooding. However, limitations and disadvantages of such conventional and traditional approaches should become apparent to one of skill in the art, through comparison of such systems with aspects of the present invention as set forth in the remainder of the present application.

BRIEF SUMMARY OF THE INVENTION

Apparatus and methods for monitoring AC power supplied to a sump pump and supplying backup AC power to the sump pump in response to insufficient AC power being supplied to the sump pump are substantially shown in and/or described in connection with at least one of the figures, and are set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Aspects of the present invention are related to powering and controlling a sump pump system. More specifically, certain embodiments of the present invention relate to apparatus, hardware and/or software systems, and associated methods that monitor operation of a sump pump system and intelligently operate a primary AC pump and/or a backup DC pump in response to a detected power failure and/or other detected operating aspects of the sump pump system.

Figure 1:
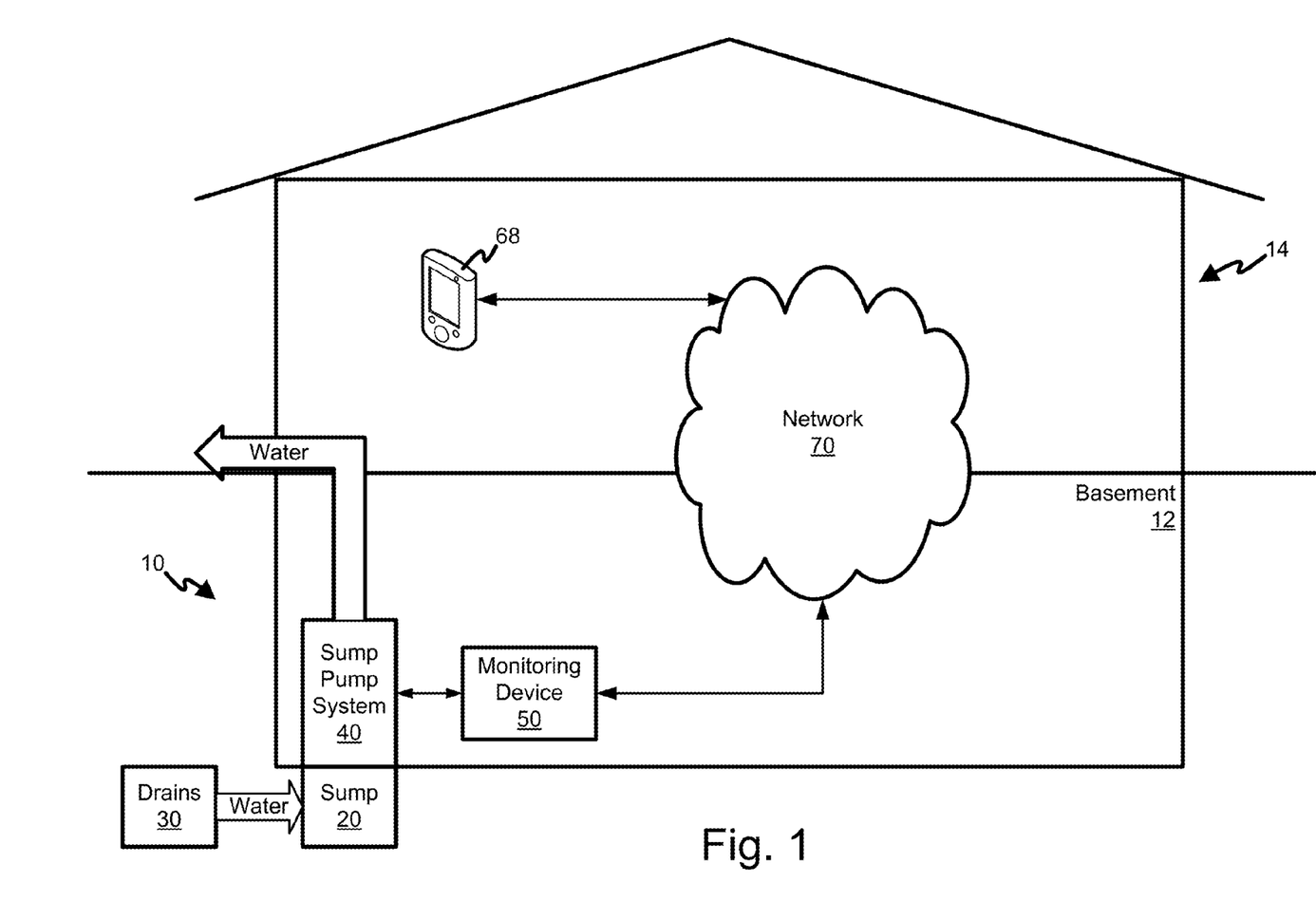
FIG. 1 shows an example water proofing system comprising a sump pump system and a monitoring device in accordance with an embodiment of the present invention.

FIG. 1 depicts an example waterproofing system 10. In particular, the waterproofing system 10 attempts to prevent flooding of a basement 12 of a home 14 by collecting ground water from the region about the basement 12 and discharging the collected water away from the home 14. To this end, the waterproofing system 10 may include a sump 20 which extends below floor level of the basement 12 and drains 30 which collect ground water from the region about the basement 12 and funnel such collected water toward the sump 20. A sump pump system 40 may pump water from the sump 20 and discharge the water away from the home 14.

In order to ensure the sump pump system 40 is operating as intended, the waterproofing system 10 may further include a separate monitoring device 50. The monitoring device 50 may monitor the sump pump system 40, determine an operating status of the sump pump system 40, and report the determined status. In particular, the monitoring device 50 may display the determined status and/or send a status message to a communications device 68 via communications network 70.

FIG. 1 depicts network 70 in home 14. However, network 70 may include several networks such has home area networks (HAN), local area networks (LAN), wide area networks (WAN), plain old telephone networks (POTS), cellular telephone networks, personal area networks (PAN), etc. which may extend beyond the scope of the home 14.

Figure 2:
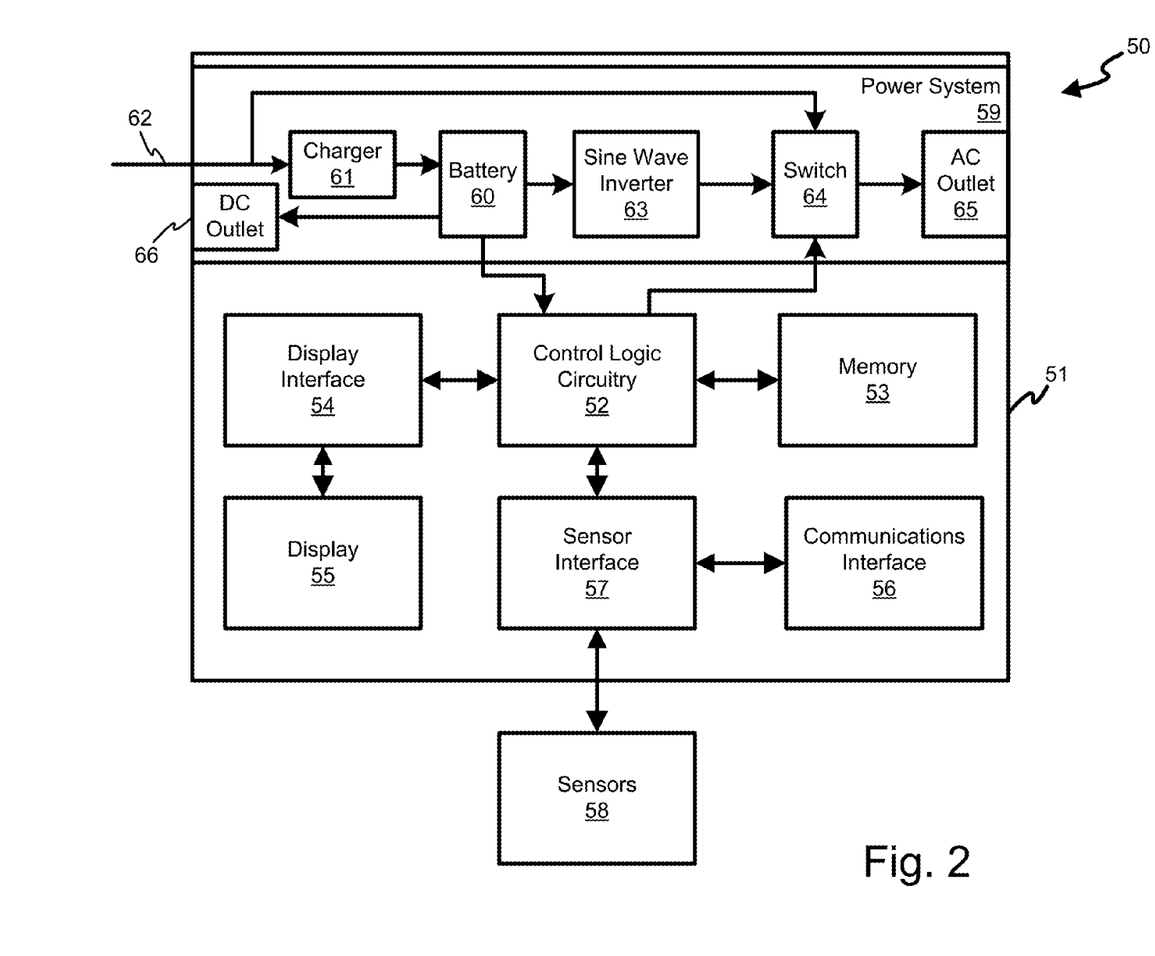
FIG. 2 shows an example embodiment of the monitoring device of FIG. 1.

Turning now to FIG. 2, the monitoring device 50 is shown in greater detail. As shown, the monitoring device 50 may include a housing 51 in which control logic circuitry 52, memory 53, a display interface 54, a display 55, a communications interface 56, and a sensor interface 57 are housed. The control logic circuitry 52 may include a microprocessor, a microcontroller, a field programmable gate array, and/or some other digital and/or analog circuitry that controls the operation of the monitoring device 50. The memory 53 may include volatile and/nonvolatile memory devices that may store data processed by and/or generated by the control logic circuitry 52 during the process of monitoring the sump pump system 40. Memory devices of the memory 53 may further store software and/or firmware instructions which the control logic circuitry 52 may execute in order to carry out one or more monitoring processes of the sump pump system 40.

The display interface 54 may interface the control logic circuitry 52 with the display 55. In particular, the display interface 54 may include circuitry that generates one or more video signals that drive the display 55. Via the display interface 54 and the display 55, the control logic circuitry 52 may present to the homeowner and/or another interested party information regarding the operating status of the sump pump system 40.

The communications interface 56 may interface the control logic circuitry 52 with the communications network 70. To this end, the communications interface 56 may include circuitry and possibly firmware that implement one or more communications protocols. In one embodiment, the communications interface 56 comprises circuitry that implements a wireless communication protocol, such as, for example, one or more of the following: WiFi (e.g., IEEE 802.11 standard based), Z-Wave, ZigBee (e.g., IEEE 802.15 standard based), Bluetooth, (e.g., IEEE 802.15.1 standard based), cellular (e.g., GPRS, EDGE, 3G, 4G, and/or LTE standard based), 60 GHz, etc. Such protocols may permit the communications interface 56 to wirelessly communicate with communications device 68 via network 70.

For example, communications interface 56 may permit the monitoring device 50 to connect to a local WiFi network 70 that provides a gateway to the Internet. Via such connection, the monitoring device 50 may send a status message to a communications device 68 such as a smart phone, laptop, tablet, desktop, or another computing device using various communications protocols such as email, instant messaging, text messaging, etc.

Alternatively or additionally, the communications interface 56 may provide the control logic circuitry 52 with a telephony interface. For example, the communications interface 56 may include a standard RJ-11 telephone jack that permits connecting a plain old telephone system to the monitoring device 50. Such a connection may permit the monitoring device 50 to call a specified number in order to contact the homeowner and/or another interested party and provide status information via a telephone network 70 and a communications device 68 such as a land line telephone or a cellular telephone. The telephony interface may further include cellular telephone support that may permit the monitoring device 50 to wirelessly send a text message and/or place a call to a specified number via a cellular telephone network without first connecting to a local land line.

As shown, the monitoring device 50 may further include a sensor interface 57. The sensor interface 57 may interface the control logic circuitry 52 with one or more sensor(s) 58 such that the control logic circuitry 52 may receive signals indicative of various operating characteristics of the sump pump system 40. Via such received signals, the control logic circuitry 52 may monitor the operation of the sump pump system 40 and determine based upon such signals whether there may be an issue with its operation that warrants reporting such issue to the homeowner and/or another interested party.

The monitoring device 50 may further include a power system 59 configured to deliver operating power to the electrical components of the monitoring device. To this end, the power system 59 may include a rechargeable battery 60, a charger 61, a power inverter 63, a switch 64, and an AC outlet 65. The charger 61 may be configured to charge the battery 60 via AC power supplied via power cord 62. The battery 60 may provide DC power to circuitry of the monitoring device 50 thus permitting the monitoring device 50 to continue to operate in the presence of an AC power outage.

As shown, the control logic circuitry 52 may be coupled to the switch 64 of the power system 59. Via the switch 64, the control logic circuitry 52 may cause power system 59 to supply the AC outlet 65 with AC power received from the power cord 62 or with AC power provided by the power inverter 63. The power inverter 63 may comprise a sine wave inverter, a modified sine wave, a square wave inverter, or some other type of power inverter that is capable of changing or converting the DC power supplied by battery 60 to AC power. In a preferred embodiment, the power inverter 63 comprises a sine wave inverter as many AC pumps require or run more efficiently when supplied with sinusoidal AC power as apposed to square wave or some other form of AC power. In this manner, the control logic circuitry 52 may actuate switch 64 so that battery 60 and power inverter 63 may continue to supply AC power to the AC outlet 65. As shown, the power system 59 may further include a DC outlet or terminals 66. The battery 60 may supply DC power to the DC outlet in order to power one or more external devices such as a DC pump.

FIG. 2 depicts the power system 59 within the housing 51 of the monitoring device 50. However, in some embodiments, one more aspects of the power system 59 may be external to the monitoring device 50. For example, the monitoring device 50 may provide terminals that permit connecting a large external battery and/or charger to the monitoring device 50 for use as the battery 60 and/or charger 61.

Figure 3:
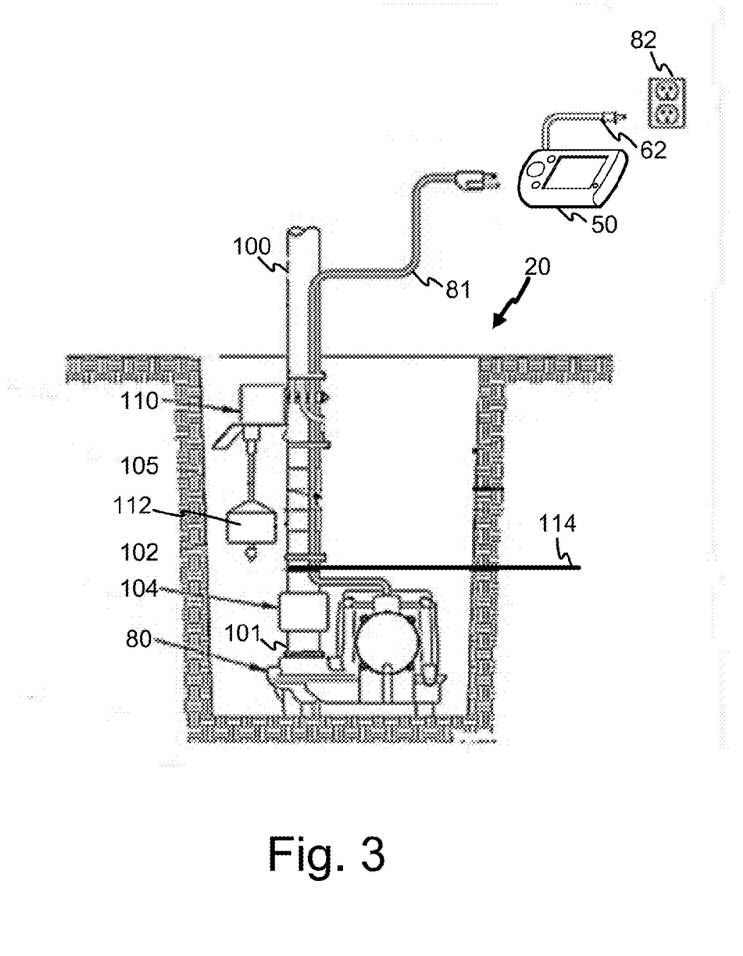
FIG. 3 shows the monitoring device of FIG. 1 connected to a sump pump system having a primary AC pump but no backup DC pump.
Figure 4:
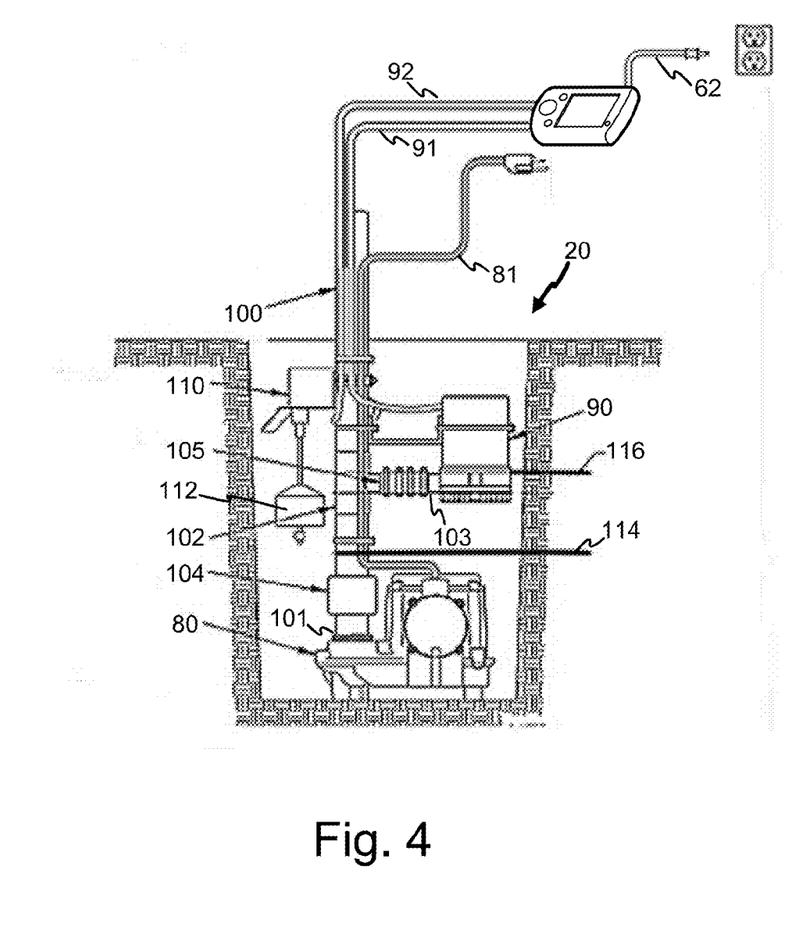
FIG. 4 shows the monitoring device of FIG. 1 connected to the sump pump system having both a primary AC pump and a backup DC pump.

Turning now to FIG. 3, further details regarding a first embodiment in which the monitoring device 50 is used with a sump pump system 40 having a primary or AC pump 80, but no secondary or DC pump (e.g., DC pump 90 of FIG. 4). As shown, the AC pump 80 may be positioned toward the bottom of the sump 20. The AC pump 80 is designed to be powered by an AC power source. As such, the AC pump 80 includes a power cord 81 that may be plugged into the AC power outlet 65 of the monitoring device 50. As explained above in regard to FIG. 2, the power system 59 of the monitoring device 50 may supply the AC power outlet 65 with AC power received via power cord 62. As such, FIG. 3 depicts that power cord 62 may be plugged into a AC outlet 82 of the home 14 in order to supply the monitoring device 50 with AC electrical power needed for its operation and the powering of the AC pump 80 via the AC outlet 65.

As shown, the sump pump system 40 may further include a discharge pipe 100 which receives water from the AC pump 80 and carries the received water away from the home 14. To this end, a lower end 101 of the discharge pipe 100 may be connected to the AC pump 80. To prevent backflow into the AC pump 80, a check valve 104 may be positioned above the lower end 101 of the discharge pipe 100.

As shown, the sump pump system 40 may further include a float activated switch 110. The float activated switch 110 may include one or more floats 112. The floats 112 may be positioned such that the float activated switch 110 turns on the AC pump 80 in response to water in the sump 20 reaching a water level 114. The float activated switch 110 may further turn off the pumps 80, 90 after the water level in the sump 20 sufficiently recedes.

During operation, the monitoring device 50 may monitor AC power supplied to power cord 62 by the AC power outlet 82. Based upon the supplied power, the monitoring device 50 may detect whether a potential fault state of the sump pump system 40 and report the potential fault state to the homeowner or another interested party so that remedial action may be taken. For example, based on sensing insufficient or no AC power being supplied by the AC power outlet 82, the monitoring device 50 may determine that there is a power outage that is preventing the AC power outlet 82 from supply of AC power to the AC pump 80 via the AC outlet 65 of the monitoring device 50. As such, the monitoring device 50 may actuate switch 64 in order to cause the battery 60 and power inverter 63 to continue supplying the AC pump 80 with AC power. Moreover, the monitoring device 50 may report such detected status of the sump pump system 40 via the display 55 and/or communication device 68.

Turning now to FIG. 4, further details regarding a second embodiment in which the monitoring device 50 is used with a sump pump system 40 having a primary or AC pump 80 and a secondary or DC pump 90. As shown, the AC pump 80 may be positioned toward the bottom of the sump 20. The AC pump 80 is designed to be powered by an AC power source. As such, the AC pump 80 includes a power cord 81 that may be plugged into an AC power outlet 65 of the monitoring device 50. As explained above in regard to FIG. 2, the power system 59 of the monitoring device 50 may supply the AC power outlet 65 with AC power received via power cord 62. As such, FIG. 4 depicts that power cord 62 may be plugged into a AC outlet 82 of the home 14 in order to supply the monitoring device 50 with AC electrical power needed for its operation and the powering of the AC pump 80 via the AC outlet 65.

As shown, the sump pump system 40 may further include secondary or backup DC pump 90. The DC pump 90 may be positioned in the sump 20 but at a level higher than the AC pump 80. Unlike the AC pump 80, the DC pump 90 is designed to be powered by a DC power source. As such, the DC pump 90 may be coupled to DC output or terminals 66 of the monitoring device 50 in order to received DC power from battery 60. As explained above, the monitoring device 50 includes a batter charger 61 that ensures the battery 60 remains charged and ready to supply DC power to the DC pump 90 in case of a power outage or other event necessitating use of the DC pump 90.

As further shown, the sump pump system 40 may also include a common discharge pipe 100 which receives water from pumps 80, 90 and carries the received water away from the home 14. To this end, the discharge pipe 100 may be coupled to both the AC pump 80 and the DC pump 90. In particular, a lower end 101 of the discharge pipe 100 may be connected to the primary pump 80. The discharge pipe 100 may be further fitted with a tee 102 that is positioned above the lower end 101. A distal end 103 of the tee 102 may be coupled to the DC pump 90 thereby connecting the DC pump 90 to the discharge pipe 100. Furthermore, to prevent backflow into the AC pump 80, a first check valve 104 is positioned between the AC pump 80 and the tee 102. Similarly, to prevent backflow into the DC pump 90, a second check valve 105 is positioned between the DC pump 90 and the discharge pipe 100.

As shown, the sump pump system 40 may further include a float activate switch 110. The float activated switch 110 may include one or more floats 112. The floats 112 may be positioned such that the float activated switch 110 turns on the AC pump 80 in response to water in the sump 20 reaching a first water level 114 and turns on the DC pump 90 in response to water in the sump 20 reaching a second water level 116 that is higher than the first water level 114. The float activated switch 110 may further turn off the pumps 80, 90 after the water level in the sump 20 sufficiently recedes.

Based upon the power received from AC outlet 82 and power supplied to pumps 80, 90, the monitoring device 50 may detect a potential fault state of the sump pump system 40 and report the potential fault state to the homeowner or another interested party so that remedial action may be taken. For example, based on supplying DC power to DC pump 90, the monitoring device 50 may determine that:
  1) water is flowing into the sump 20 faster than the AC pump 80 is able to discharge the water; and/or
  2) the AC pump 90 is not running due to the AC pump 90 malfunctioning.

The monitoring device 50 may then report such detected status of the sump pump system 40 via the display 55 and/or communication device 68.

Figure 5:
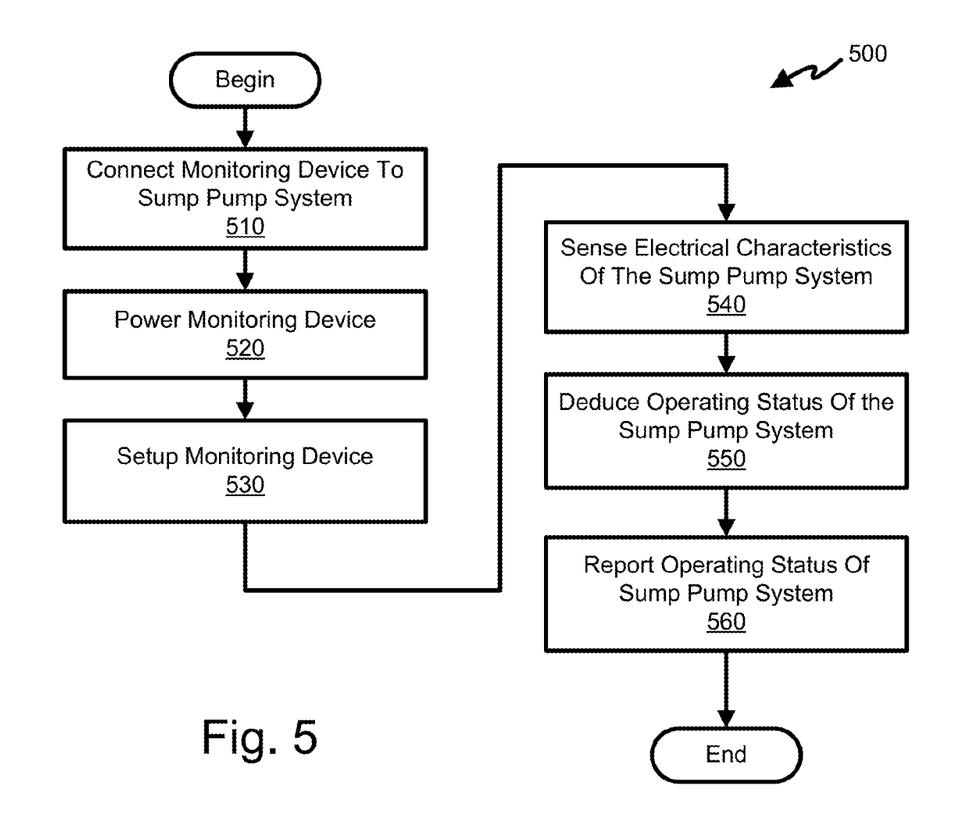
FIG. 5 shows a flowchart of an example method of installing and operating the monitoring device of FIG. 1.

Referring now to FIG. 5, a method 500 of installing and operating the sump pump monitoring device 50 is shown. The method 500 is described from the standpoint of a homeowner installing the monitoring device 50 in order to emphasis the ease by which the monitoring device 50 may be installed. However, it should be appreciated that the method of installation is not solely limited to homeowner installations. For example, a homeowner may still hire a technician to perform the installation.

At 510, a homeowner may connect the monitoring device 50 to the sump pump system 40. In particular, the homeowner may plug the power cord 81 of the AC pump 80 into the AC power outlet 65 of the monitoring device 50. If the sump pump system 40 has a DC backup pump 90, then the homeowner may further connect leads 91, 92 of the DC pump 90 to the DC outlet or terminals 66 of the monitoring device 50.

At 520, the homeowner may plug the power cord 62 of the monitoring device 50 into a power outlet 82 of the home 14. The monitoring device 50 may use the AC power supplied by the power outlet 82 to charge the battery 60 which supplies DC power to DC pump 90. As explained above, the monitoring device 50 may pass AC power received from the power outlet 82 through to the AC power outlet 65 in order to power the AC pump 80. Moreover, the monitoring device 50 may actuate switch 64 so that the power inverter 63 may deliver AC power to the AC power outlet 65 by converting DC power received from battery 60.

The homeowner at 530 may configure and/or setup the monitoring device 50. To this end, the monitoring device 50 via display 55 may ask the homeowner to answer a series of questions which configure the monitoring device 50. For example, via the setup process, the homeowner may select a mode of communication to be used to report status to the homeowner. For example, the homeowner may supply an email address, the telephone number, etc. which the monitoring device 50 may use to contact a communication device 68. Moreover, the setup process may permit the homeowner to provide or select various information (e.g., WEP passwords, IP gateway address, network identifier, etc.) needed by the monitoring device 50 in order to connect to the network 70. However, in some embodiments, the monitoring device 50 may be capable of automatically discovering and connecting to the network 70 without intervention from the homeowner.

After installation and setup, the monitoring device 50 at 540 may sense various electrical operating characteristics of the sump pump system 40. In particular, the monitoring device 50 may include one or more current and/or voltage sensors 58 associated with the power cord 62, AC outlet 65, and DC outlet 66. Via such sensors, the monitoring device 50 may sense DC current and/or voltage supplied to the DC pump 90 via the DC outlet 66. The monitoring device 50 may further sense AC current and/or voltage received via power cord 62. Furthermore, the monitoring device 50 may further sense AC current and/or voltage supplied to the AC pump 80 via the AC power outlet 65.

At 550, the monitoring device 50 may deduce an operating status of the sump pump system 40 based on the sensed electrical characteristics. For example, the monitoring device 50 may be able to deduce whether the AC pump is running, whether the DC pump is running, whether there is an AC power outage, etc, based upon the sensed electrical characteristics.

Finally, the monitoring device 50 at 560 may report the deduced operating status. In particular, the monitoring device 50 may present the status upon the display 55. The monitoring device 50 may also send a reporting message to a communications device 68 via the network 70. To this end, the monitoring device 50 may utilize information provided via the setup process to place a call, send an email message, etc. to the communications device 68 such that an interested party (e.g., homeowner, landlord, property management company, etc.) may be informed of the deduced operating status of the sump pump system 40. Such reporting may enable an interested party that is remotely located and away from the home 14 to receive information regarding an operating status of the sump pump system 40 and undertake appropriate remedial action in light of such information.

Figure 6:
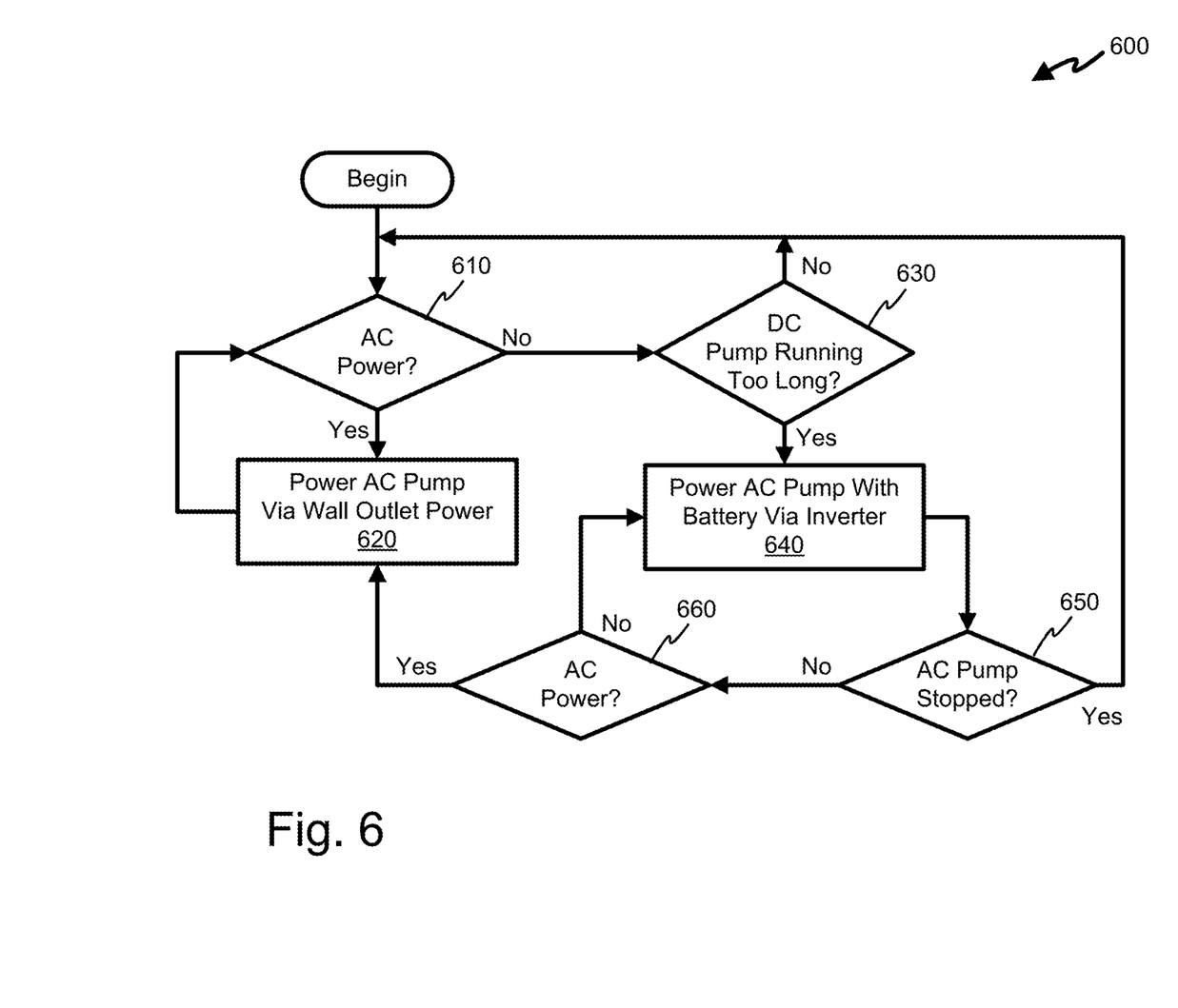
FIG. 6 shows a flowchart of an example method that may be implemented by the monitoring device of FIG. 1 to control the supply of power to an AC pump and a DC pump of a sump pump system.

Referring now to FIG. 6, a flowchart for a method 600 that may be implemented by the monitoring device 50 to control power supplied to the AC pump 80 and the DC pump 90 of the sump pump system 40 shown in FIG. 4. In particular, the flowchart provides details concerning one manner by which the monitoring device 50 may control the flow of power to the AC pump 80 and the DC pump 90 in response to detecting that insufficient AC power is being received via the power cord 62. The following assumes that the float activated switch 110 turns the AC pump 80 on in response to the water in the sump 20 reaching a first level 114 and turns the DC pump 90 on in response to the water in the sump 20 reaching a second level 116. The following also assumes that the float activated switch 110 further turns off the pumps 80, 90 after the water level in the sump 20 sufficiently recedes. While the float activated switch 110 may switch the AC pump 80 and DC pump 90 off and on, the monitoring device 50 may further effect whether the AC pump 80 and/or DC pump 90 are in fact operating by controlling the supply of power to the respective pumps 80 and 90 as explained more fully below.

At 610, the monitoring device 50 may determine whether the power cord 62 is receiving sufficient AC power to power the AC pump 80. If the monitoring device 50 determines the power cord 62 is receiving sufficient AC power, the monitoring device 50 at 620 may actuate switch 64 so that the AC power received from the power cord 62 is directed to the AC pump 80 via AC outlet 65 of the monitoring device 50. In this manner, the monitoring device 50 directs AC power to the AC pump 80. However, despite receiving AC power, the AC pump 80 may nonetheless be off. For example, the water level in the sump 20 may be below the first level 114. As such, the float activated switch 110 may have switched-off the AC pump 80. However, when the water level rises above the first level 114, the float activated switch 110 may switch-on the AC pump 80 and if the monitoring device 50 continues to detect sufficient AC power at 610 and continues to power the AC pump at 620, then the AC pump 80 will pump water from the sump 20.

If the monitoring device 50, however, detects insufficient AC power at 610, then the monitoring device 50 at 630 may determine whether the DC pump 90 has been running too long. As shown in FIG. 2, the battery 60 of the monitoring device 50 is coupled to the DC outlet 66 which supplies DC power to the DC pump 90. Thus, assuming the battery 60 has not been fully drained of charge, the monitoring device 50 continually supplies the DC pump 90 with DC power. The float activated switch 110, however, switches-on the DC pump 90 when the water level in the sump 20 rises above the second level 116. Thus, despite receiving DC power from the battery 60, the float activated switch 110 effectively switches the DC pump 90 off and on based on the water level of the sump 20. At 630, the monitoring device 50 may determine whether the DC pump 90 is able to keep up with the ingress of water into the sump 20. If the DC pump 90 is pumping water from the sump 20 at a faster rate than water is entering the sump 20, then the water level in the sump 20 should recede below the second level 116 within a predetermined period of time thus causing the float activated switch 110 to switch-off the DC pump 90. However, if the DC pump 90 is running for an extended period of time, the monitoring device 50 at 630 may determine that water is flowing into the sump 20 at a rate faster than the DC pump 90 can effectively handle.

In response to determining that the DC pump 90 has run for too long, the monitoring device 50 at 640 may actuate switch 64 in order to cause the power inverter 63 to provide AC power to the AC pump 80 as a result of converting DC power received from the battery 60. Since the water level is above the second level 116, the float actuated switch 110 may have both the AC pump 80 and DC pump 90 switched-on. The battery 60 may power both AC pump 80 and DC pump 90 until the water sufficiently recedes. In particular, the float activate switch 110 may switch-off the DC pump 90 once the water recedes below the second level 116 and eventually switch-off the AC pump 80 once the water recedes below the first level 114.

At 650, the monitoring device 50 may determine whether the AC pump 80 has switched-off. For example, the float activated switch 110 may switch-off the AC pump 80 once the water recedes below the first level 114. If the AC pump 80 has switched-off, the monitoring device 50 may return to 610 to continue to monitor the AC power received from the power cord 62 and preferentially run the DC pump 90 if the received AC power remains insufficient. If the AC pump 80 has not switched-off, the monitoring device 50 at 660 may periodically and/or continually check whether the power cord 62 is receiving sufficient AC power. For example, power may have been restored after an intermittent or extended outage. If the power cord 62 is receiving sufficient AC power, then the monitoring device 50 may return to 620 to supply the AC pump 80 with AC power from the power cord 62 instead of AC power from the battery 60 and power inverter 63. Otherwise, the monitoring device 50 at 640 may continue to power the AC pump 80 with the battery 60 and power inverter 63.

The above method 600 provides a preference for running the AC pump 80 when AC power is available via the power cord 62 and running the DC pump 90 when AC power from the power cord 62 is unavailable. Power inverters generally introduce a loss of energy as a result of converting DC power to AC power. As such, when AC power from the power cord 62 is unavailable or otherwise insufficient, the monitoring device 60 may increase the energy efficiency of the sump pump system 40 and thus increase the length of the time the sump pump system 40 can operate from battery 60 by using the DC pump 90 instead of the AC pump 80. However, AC pumps are generally capable of a greater flow rate and than DC pumps. As such, the method 600 runs the AC pump 80 when the DC pump 90 is unable to remove water from the sump 20 at a sufficient rate in order to reduce the risk of the sump 20 overflowing.

Various embodiments of the invention have been described herein by way of example and not by way of limitation in the accompanying figures. For clarity of illustration, exemplary elements illustrated in the figures may not necessarily be drawn to scale. In this regard, for example, the dimensions of some of the elements may be exaggerated relative to other elements to provide clarity. Furthermore, where considered appropriate, reference labels have been repeated among the figures to indicate corresponding or analogous elements.

Moreover, certain embodiments may be implemented as a plurality of instructions on a non-transitory, computer readable storage medium such as, for example, flash memory devices, hard disk devices, compact disc media, DVD media, EEPROMs, etc. Such instructions, when executed by control logic circuitry 52, may result in the monitoring device 50 implementing various previously described monitoring, deducing, and/or reporting aspects of monitoring device 50.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment or embodiments disclosed, but that the present invention encompasses all embodiments falling within the scope of the appended claims.

What is claimed is:

1. A monitoring system for monitoring a sump pump system, comprising:
   a first power cord configured to receive alternating current (AC) power from a first power outlet;
   a battery configured to store electrical energy;
   a charger configured to charge the battery from AC power received via the first power cord;
   a power inverter configured to generate AC power from direct current (DC) power supplied by the battery;
   a second power outlet configured to receive a second power cord for an AC pump of the sump pump system;
   a third power outlet configured to receive a third power cord for a DC pump of the sump pump system and to provide the DC pump with DC power from the battery;
   a switch configured to select between AC power received from the first power cord and AC power generated by the power inverter and to provide the selected AC power to the second AC power outlet; and
   control logic circuitry configured to supply the AC pump with power from the battery in response to determining that the DC pump is unable to remove water from the sump at a rate faster than an ingress of water into the sump and that AC power received from the first power cord is insufficient to power the AC pump.

2. The monitoring system of claim 1, wherein:
   the control logic is further configured to deduce an operating status of the sump pump system based upon sensed electrical characteristics of AC power received via the first power cord, and actuate the switch based on the deduced operating status; and
   the monitoring system further comprises a communications interface configured to report the deduced operating status to an interested party via a communications device.

3. The monitoring system of claim 2, further comprising a display, wherein the control logic circuitry is further configured to cause the display to present the deduced operating status.

4. The monitoring system of claim 2, wherein the control logic circuitry is further configured to deduce the operating status based further upon AC power supplied to the AC pump via the second power outlet.

5. The monitoring system of claim 1, wherein the power inverter comprises a sine wave inverter.

6. The monitoring system of claim 1, wherein the control logic circuitry is further configured to determine that the DC pump is unable to remove water from the sump at a rate faster than an ingress of water into the sump in response to determining that the DC pump has been running for a predetermined period of time.

7. A waterproofing system, comprising:
   a monitoring device comprising a battery, a power inverter, a power outlet, and a first power cord, wherein the power cord is configured to receive alternative current (AC) power from an AC power outlet into which the power cord is plugged; and
   a sump pump system comprising a sump, a direct current (DC) pump coupled to the monitoring device, and an AC pump having a second power cord plugged into the power outlet of the monitoring device;
   wherein the AC pump, when supplied with AC power sufficient to operate the AC pump, is configured to pump water from the sump in response to water rising above a first water level;
   wherein the DC pump, when supplied with DC power sufficient to operate the DC pump, is configured to pump water from the sump in response to water rising above a second water level higher than the first water level; and
   wherein the monitoring device is configured to:
      supply the DC pump, via the battery, with sufficient DC power to operate; and
      in response to determining that the DC pump is unable to remove water from the sump at a rate faster than an ingress of water into the sump and that AC power received via the first power cord is insufficient to operate the AC pump, provide the AC pump with sufficient AC power to operate via the battery, the power inverter, and the power outlet of the monitoring device.

8. The waterproofing system of claim 7, wherein the monitoring device is further configured to a report a deduced operating status of the sump pump system to an interested party.

9. The waterproofing system of claim 7, wherein the power inverter comprises a sine wave inverter.

10. The waterproofing system of claim 7, wherein the monitoring device is further configured to deduce an operating status of the sump pump system based upon AC power supplied to the AC pump.

11. The waterproofing system of claim 7, wherein the monitoring device is further configured to determine that the DC pump is unable to remove water from the sump at a rate faster than an ingress of water into the sump in response to determining that the DC pump has been running for a predetermined period of time.

12. A method of operating a sump pump system, the method comprising:
   supplying a direct current (DC) pump with power from a battery of a monitoring device;
   pumping water from a sump using the DC pump; and
   in response to determining that the DC pump is unable to remove water from the sump at a rate faster than an ingress of water into the sump, supplying an alternating current (AC) pump with power, and pumping water from the sump simultaneously using both the DC pump and the AC pump.

13. The method of claim 12, further comprising deducing, with the monitoring device, an operating status of the sump pump system based upon sensed electrical characteristics of the received AC power.

14. The method of claim 13, further comprising reporting the deduced operating status.

15. The method of claim 13, further comprising deducing the operating status based further upon AC power supplied to the AC pump.

16. The method of claim 12, further comprising, in response to determining that the received AC power is sufficient to operate the AC sump pump, switching from supplying the AC pump with power from the battery to supplying the AC pump with the received AC power.

17. The method of claim 12, further comprising,
   shutting-off the DC pump in response to water in the sump receding below a first water level; and
   shutting-off the AC pump in response to water in the sump receding below a second water level that is lower than the first water level.

18. The method of claim 12, further comprising determining that the DC pump is unable to remove water from the sump at a rate faster than an ingress of water into the sump in response to determining that the DC pump has been running for a predetermined period of time.

* * * * *